(12) United States Patent
Chacon et al.

(10) Patent No.: US 6,391,668 B1
(45) Date of Patent: May 21, 2002

(54) METHOD OF DETERMINING A TRAP DENSITY OF A SEMICONDUCTOR/OXIDE INTERFACE BY A CONTACTLESS CHARGE TECHNIQUE

(75) Inventors: Carlos M. Chacon; Sundar S. Chetlur; Brian E. Harding; Minesh A. Patel; Pradip K. Roy, all of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/562,346

(22) Filed: May 1, 2000

(51) Int. Cl.$^7$ ................................................ H01L 21/66
(52) U.S. Cl. ........................ 438/17; 438/197; 324/769
(58) Field of Search ....................... 438/17, 471, 476, 438/197; 324/769

(56) References Cited

U.S. PATENT DOCUMENTS

| | | | |
|---|---|---|---|
| 3,943,442 A | * | 3/1976 | Fletcher et al. |
| 4,382,229 A | * | 5/1983 | Cottrell et al. |
| 4,812,756 A | * | 3/1989 | Curtis et al. |
| 5,485,091 A | * | 1/1996 | Verkuil |
| 6,011,404 A | * | 1/2000 | Ma et al. |
| 6,037,797 A | * | 3/2000 | Lagowski et al. |
| 6,069,017 A | * | 5/2000 | Kamieniecki et al. |
| 6,195,605 B1 | * | 2/2001 | Miller et al. |

FOREIGN PATENT DOCUMENTS

JP 59-151047 A * 8/1984

OTHER PUBLICATIONS

Y. Maneglia and D. Bauza, "Extraction of the Si–SiO2 Interface Trap Layer Parameters in MOS Transistors Using a New Charge Pumping Analysis," Proc. IEEE 1998 Int. Conference on Microelectronic Test Structures, vol. 11, pp. 201–205, Mar. 1998.*

Suzuki et al., "Extraction of the Trap Density at the Gate Periphery Using the Gated Diode Array for Giga–bit DRAMs," Proc. IEEE 1999 Int. Conference on Microelectronic Test Structures, vol. 12, pp. 121–124, Mar. 1999.*

* cited by examiner

Primary Examiner—Charles Bowers
Assistant Examiner—Stephen W. Smoot

(57) ABSTRACT

The present invention provides a method of determining a trap density of a semiconductor substrate/dielectric interface. In one embodiment, the method comprises measuring a current within a semiconductor substrate resulting from a flow of carriers from traps located near the interface, wherein the measured current is a function of the number of traps located at the interface, and determining the trap density as a function of the measured current.

33 Claims, 4 Drawing Sheets

METHOD OF DETERMINING A TRAP DENSITY OF A SEMICONDUCTOR/OXIDE INTERFACE BY A CONTACTLESS CHARGE TECHNIQUE

TECHNICAL FIELD OF THE INVENTION

The present invention is directed, in general, to a method of testing a gate oxide located on a semiconductor wafer and, more specifically, to a method of determining the interface trapped charge at the substrate/dielectric layer interface by a contactless charge technique.

BACKGROUND OF THE INVENTION

The use of and different methods for manufacturing semiconductors have reached phenomenal proportions over the last decade. Equally phenomenal has been the ever decreasing device size of the semiconductors in general, including gate oxide thickness. It is particularly desirable to make the thickness of the gate oxide as small as possible because the drive current in semiconductor devices increases with decreasing gate oxide thickness. Thus, the on-going trends toward ever thinner gate oxides are making tight in-line monitoring of gate oxide quality and uniformity even more critical to semiconductor manufacturers, particularly now that gate oxide thickness is approaching a size less than 25 nm. The quality of the gate oxide can be determined from a number of characteristics, such as charge contamination ($Q_m$), the degree of density of interface traps ($D_{it}$) and the flatband voltage ($V_{fb}$).

Present techniques for determining these characteristics include techniques, such as charge pumping, Capacitance-Voltage (CV) testing, and Corona Oxide Semiconductor (COS) wafer testing. Each one of these techniques, however, suffer from its own disadvantages.

Conventional charge pumping involves pumping charge into a completed metal oxide field effect transistor (MOSFET) to obtain interface trap information. While charge pumping has been used successfully, it requires a fully completed MOSFET device. Because a full MOSFET structure is required, more time is required to obtain the desired data regarding the quality of the gate oxide. In the interim, hundreds of product may have been produced which are later found to have a poor quality gate oxide, making them unacceptable for sale. Additionally, when testing a fully completed MOSFET device, the gate oxide information is buried in subsequent complementary metal oxide semiconductor (CMOS) processing steps, and so intrinsic gate oxide quality is hard to deconvolute on a fully processed wafer. For example, during normal processing steps, the silicon/oxide interface can become passivated with hydrogen. This passivation can mask the initial quality of the gate oxide when tested with the charge-pumping technique such that data regarding the initial quality of the gate oxide is extremely difficult to obtain.

C-V testing is also another well known method for testing semiconductor devices. C-V testing is based on measuring the metal oxide semiconductor ("MOS") capacitance as a function of applied bias, to gain important information about the quality and reliability of gate oxides. However, while C-V techniques are well known and of relatively low cost, the procedure suffers from the disadvantage that the process has a slow test turnaround time. The slow turnaround time is largely due to the added aluminum evaporation or photolithographic patterning required for the test capacitor sample, which slows down production. In addition, C-V techniques require a standard sample, against which the test results are compared. This, of course, can introduce unacceptable error into the results when the actual product begins to drift significantly from the standard.

Corona Oxide Semiconductor ("COS") wafer testing is also being extensively used. This technique requires no physical contact with the wafer, so the device's electrical characteristic data can be obtained without the added processing time and cost associated with forming a complete MOSFET device. In conventional COS, a variety of charge-trapping parameters of the dielectric can be measured, such as charge contamination ($Q_m$), the degree of density of interface traps ($D_{it}$), the flatband voltage ($V_{fb}$) and the level of mobile charge carrier. The draw back to the COS technique, however, is that it requires the use of a monitor wafer, similar to the C-V technique. As previously stated, there is a strong possibility of data errors when the actual product being tested begins to drift significantly from the monitor wafer. In addition, however, the monitor wafer itself is also subject to hydrogen drift over a period of time. In drift, the hydrogen can occupy the dangling bond sites that exist in the oxide, which can affect the quality of the oxide and also give erroneous trap charge data.

Thus, as seen from the foregoing conventional testing processes, there is not presently a method of determining interface trap information without either encountering significant downtime or drift problems in the monitor wafer, which decreases in accuracy over a period of time.

Accordingly, what is needed in the art is a method of testing the initial quality of a silicon/silicon dioxide interface without the disadvantages associated with the above-discussed techniques.

SUMMARY OF THE INVENTION

To address the above-discussed deficiencies of the prior art, the present invention provides a method of determining a trap density of a semiconductor substrate/dielectric interface. In one advantageous embodiment, the method comprises measuring a current within a semiconductor substrate resulting from a flow of carriers from traps located near the interface, wherein the measured current is a function of the number of traps located at the interface. The trap density can be determined as a function of the measured current.

The method may further include a step of filling interface traps. In one aspect, the traps are filled by depositing a charge on a surface of the dielectric layer to form an inversion region, which causes the minority carriers to move toward the substrate/dielectric interface and fill the interface traps in the dielectric. In another aspect, a deep depletion region is formed by quickly depositing more of the same charge used to form the depletion region. This particular embodiment may further include forming an accumulation region within the deep depletion region. The accumulation region may be formed by depositing a charge opposite to the charge previously placed on the dielectric through an opening in a guard ring and onto the dielectric to bring a portion of the deep depletion region into accumulation. This effectively forms pseudo or transient source and drain regions into which carriers flow during the accumulation phase.

A current is generated by the formation of the accumulation region when minority carriers that are trapped in the interface recombine with the majority carriers. Alternatively, the current may be formed by allowing the semiconductor substrate to return to a flatband condition, at which point the minority carriers recombine with the majority carriers. In either case, a current results when the minority carriers leave the traps and recombine with the majority carriers. From this current, the interface trap charge can be determined. The dopant of the substrate may, of course, vary. For example, the substrate may be doped with a p-type dopant, and in such instances, the charge deposited on the substrate is a positive charge and the opposite charge is a negative charge. Alternatively, the dopant may by an n-type dopant, and in such instance the charge deposited on the substrate is a negative charge and the opposite charge is a positive charge.

In those embodiments where the accumulation region is formed in the deep depletion region, pseudo or transient source/drain structures are formed in the wafer substrate without implants and without the need for metal contacts. Moreover, the present invention allows for in-line, fast testing of gate oxide quality as it is being processed. Quick turn around times for determining the quality of the dielectric layer are provided, which in turn, provides readily available processing data that can be used to correct any deficiencies in the fabrication process that affect the quality of the dielectric layer. As a result, fewer wafers are scrapped and time is saved in the overall fabrication process, resulting in a more cost effective process. Thus, in one aspect, the present invention provides a method of determining electrical characterizations of an substrate interface within a semiconductor wafer without the need of fabricating a complete MOSFET device or relying on a monitor wafer.

The present invention provides another embodiment in which traps located at the interface are filled with minority carriers by forming a depletion region within a substrate. At least a portion of the depletion region is collapsed to either flatband or accumulation conditions. Then, a trap density is determined as a function of a current resulting from a recombination of majority carriers with the minority carriers that occurs at accumulation or flatband conditions. Preferably, a portion of the substrate is brought into accumulation by placing a guard ring over the dielectric layer and placing a charge opposite to the one used to form the depletion region is deposited on the dielectric layer through an opening in the guard ring. The opposite charge causes the majority carrier to move to the interface, and when sufficient majority carrier are present, the minority traps move from the traps and recombine with the majority carrier. The movement of the minority traps results in a current flow within the substrate that can be use to determine the trap density of the dielectric layer.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
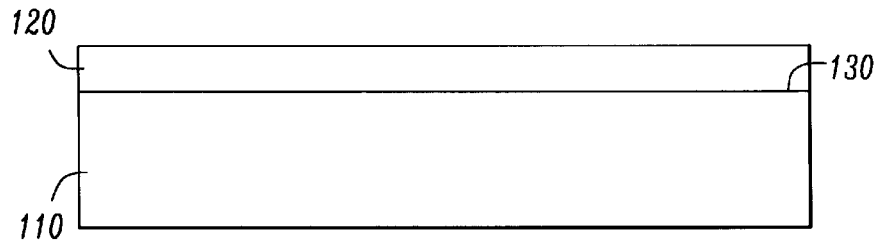
FIG. 1 illustrates a semiconductor test wafer that includes a wafer substrate, with a dielectric layer deposited thereon.

Referring initially to FIG. 1, there is illustrated, in one embodiment, a semiconductor test wafer 100 that includes a wafer substrate 110 with a dielectric layer 120 deposited thereon. The surface of the wafer substrate 110 forms an interface 130 with the dielectric layer 120, for example a silicon/silicon dioxide interface. The semiconductor test wafer 100, as illustrated, is preferably fabricated to the point shown with the same processes used to manufacture completed semiconductor devices, such as integrated circuits (ICs). The wafer substrate 110 may be any type of substrate on which ICs are typically formed. For example, it may be a substrate doped with either a p-type dopant or an n-type dopant. The dielectric layer 120 is preferably a silicon dioxide layer and is deposited with the same processing parameters used to deposit dielectrics on a completed device.

It should be noted at this point that theories of metal oxide semiconductor (MOS) physics will be discussed with respect to the figures that follow. However, it should be understood that the present invention is not intended to be limited by any of those theories. While it is believed that these theories are plausible given the present day understanding of the technology, it is possible that the device may be functioning in a completely different way, but at the same time, achieving the desired trap charge data.

Figure 2A:
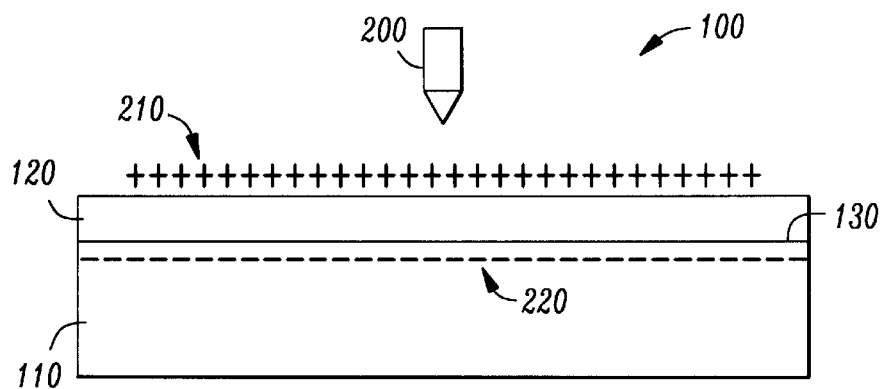
FIG. 2A illustrates the semiconductor test wafer being subjected to a charge, such a charge causing the traps at the dielectric/wafer substrate to fill interface traps.

Turning now to FIG. 2A, once the semiconductor test wafer 100 is completed, it is positioned under a charge source, such as a corona gun 200. An initial charge 210 is deposited on the surface of the dielectric layer 120. The charge 210 that is deposited, of course, depends on the type of dopant in the wafer substrate 110. For example, if the wafer substrate 110 is doped with a p-type dopant, the charge 210 will be positive, and if the wafer substrate 110 is doped with an n-type dopant the charge 210 will be negative. In the embodiment shown in FIG. 2A, the wafer substrate 110 is doped with a p-type dopant. Thus, as shown, the charge 210 is positive.

The positive charge 210 is deposited on the dielectric layer's 120 surface, which ultimately causes the interface traps to be filled with minority carriers. One way in which this trap filling phase may be accomplished is by driving the wafer substrate 110 to inversion, which in the illustrated embodiment is a p-type substrate. During inversion, the majority carriers, or in this case holes, are pushed away from the surface, creating an inversion region consisting primarily of minority carriers or electrons 220 near the interface 130.

As the electrons 220 collect near the interface 130, the electrons 220 occupy interface traps (not shown) that exist, near the interface 130. Another way in which the trap filling may occur is for the wafer substrate 110 to be driven into depletion, and then over a period of time allow the wafer substrate to go back towards equilibrium, during which time the traps are filled. Since this takes a longer period of time, the inversion technique is a more preferred way in which to fill the traps.

Figure 2B:
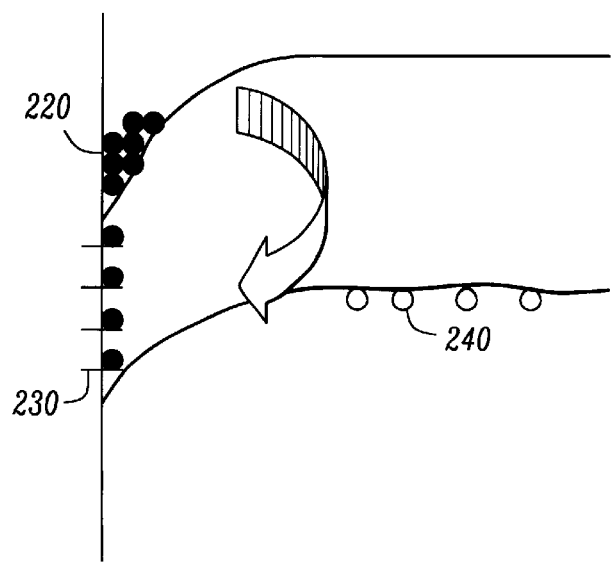
FIG. 2B illustrates an energy-band diagram showing the position of electrons and holes during the trap filling phase.

FIG. 2B is an energy-band diagram illustrating the position of electrons 220 during inversion of the wafer substrate 110. For clarity, only the semiconductor is shown in FIG. 2B. The interface traps 230 that are continuously distributed throughout the band gap are represented by the small horizontal lines at the interface with filled circles, representing the electrons 220 occupying the interface traps 230, and blank circles 240, representing holes deeper in the substrate.

Figure 3A:
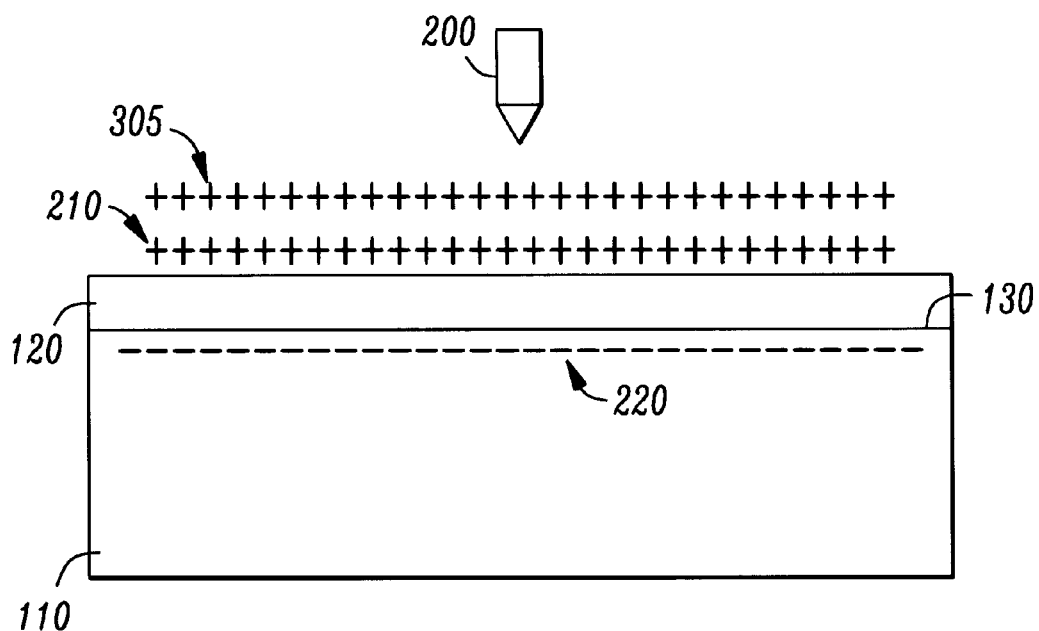
FIG. 3A illustrates an additional charge deposited on to the dielectric layer forcing the silicon substrate into deep depletion.
Figure 3B:
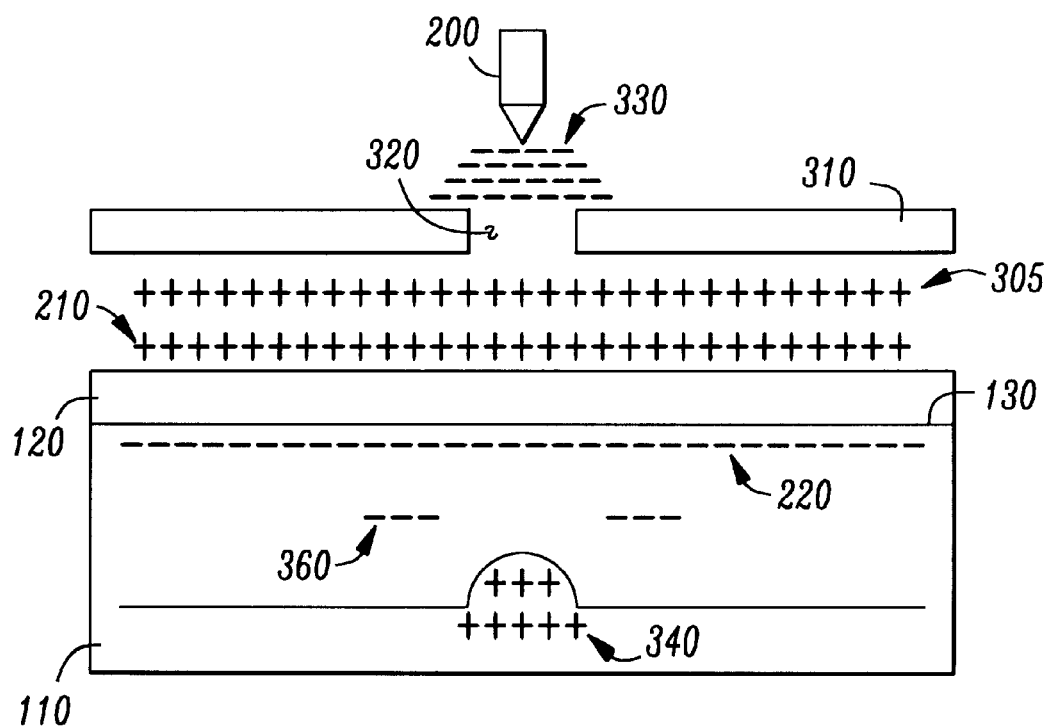
FIG. 3B illustrates a charge, opposite to the charge in FIG. 2A, being deposited onto the dielectric layer through an opening in a guard ring.

Turning now to FIGS. 3A and 3B, additional charge 305 is deposited onto the dielectric layer, which drives the silicon into deep depletion. Following this step, a guard ring 310 having an opening 320 formed therein is positioned over the charge 210 and charge 305 that are deposited on the surface of the dielectric layer 120. An opposite charge 330 is deposited onto the dielectric layer 120 through the opening 320. In the embodiment shown, the charge 330 is negative since a positive charge is needed to bring the p-type substrate 110 into deep depletion. Of course, if the substrate 110 is an n-type, the charges 210, 305 and 330 would each be reversed. The application of the negative charge 330 causes majority carriers 340, i.e., holes in this particular embodiment, to begin to move toward the interface 130 in the area of the substrate 110 defined by the opening 320, as illustrated in FIG. 3B. The upward movement of the majority carriers 340 causes the minority carriers 360, i.e. electrons in this particular embodiment, to be moved to either side.

Figure 4:
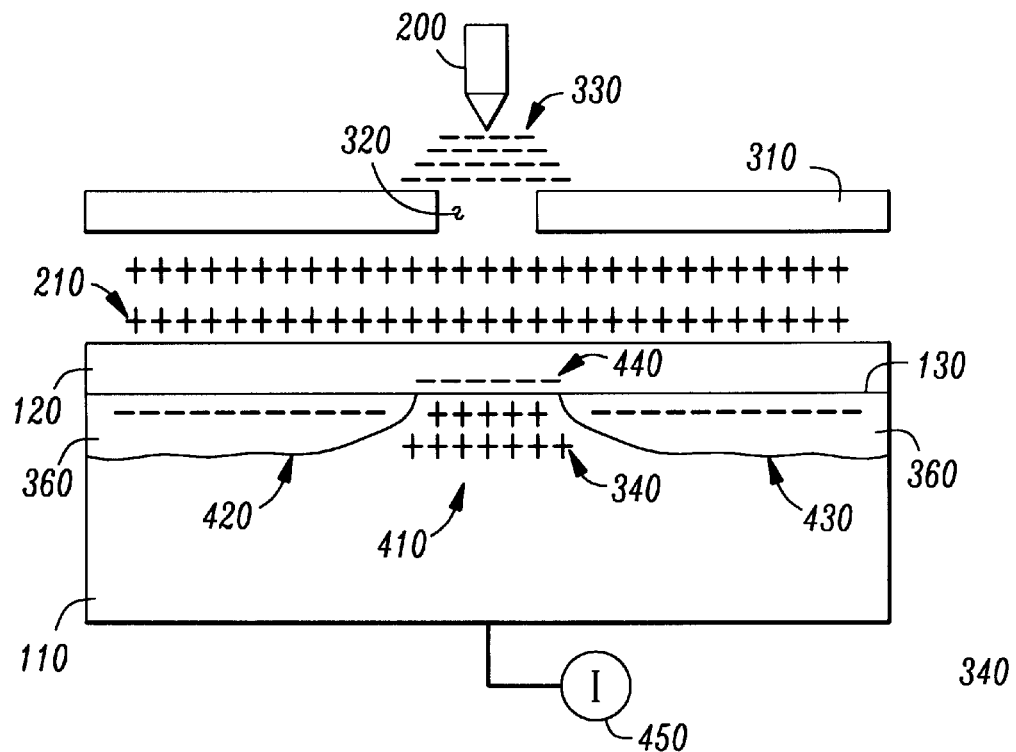
FIG. 4 illustrates formation of pseudo or transient source/drain regions around an accumulation region.
Figure 5:
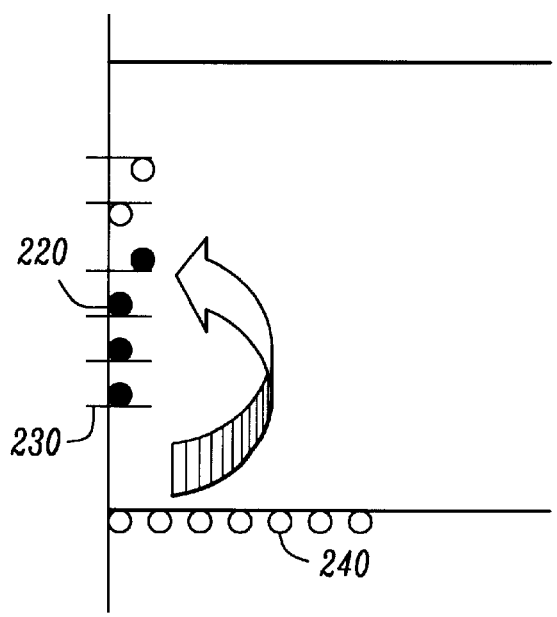
FIG. 5 illustrates minority carriers that are trapped in the interface traps, recombining with the majority carriers in the accumulation region.

Referring now to FIGS. 4 and 5, when enough negative charge 330 is applied, the surface changes from inversion to accumulation. In the illustrated embodiment, the majority carriers 340 are drawn to the interface 130 to form an accumulation region 410. As the accumulation region 410 is formed, the free minority carriers 360 (i.e., those that are not trapped in the interface traps) drift to either side of the accumulation region 410 into pseudo or transient source/drain regions 420, 430 around the accumulation region 410; that is, the source/drain regions 420, 430 exist only when the appropriate charge is being applied. Once the accumulation region 410 is formed, minority carriers 440 that are trapped in the interface traps recombine with the majority carriers 340 in the accumulation region 410. (See FIG. 5). FIG. 5 is an energy-band diagram illustrating the position of electrons 220 during accumulation of the wafer substrate. For clarity, only the semiconductor is shown in FIG. 5. The interface traps 230 that are continuously distributed throughout the band gap are represented by the small horizontal lines at the interface with filled circles, representing the electrons 220 occupying the interface traps 230, and blank circles 240, representing holes deeper in the substrate. It should be noted that another way that could be used to recombine the trapped minority carriers 440 with majority carriers 340 is to allow all charge on the surface of the dielectric layer 120 to dissipate and allow the device to return to flatband conditions. As the device moves toward flatband, the substrate 110 would return to equilibrium conditions; that is, the majority carriers 340 would move toward the interface 130 at which time they would recombine with the trapped minority carriers 440.

Figure 6:
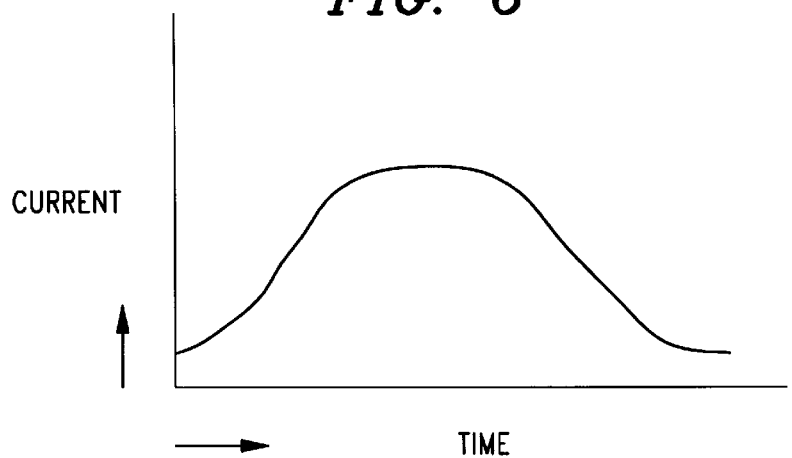
FIG. 6 illustrates a graph representing current flow, measured by an ammeter, as a function of time.

The recombination of the minority carrier 440 and the majority carriers 340 causes a current to flow through the ammeter 450 as a function of time; this relationship is illustrated in FIG. 6. The number of interface trapped charges/cm² ($N_{it}$) can then be determined from the amount of current read on the ammeter as a function of time as given by:

$$N_{it} \int^T_0 I(h)$$

Alternatively, the interface trap charges can also be expressed as the number of interface trap charges per unit area and energy ($D_{it}$ charges/cm²-eV). It has been found that the number of interface trapped charges is an excellent tool in determining the quality of the gate oxide. As seen from above, this test can easily be run on a test wafer having just been fabricated. Thus, the present invention uniquely provides an in-line, fast method for testing the gate quality as it is being processed.

Figure 7:
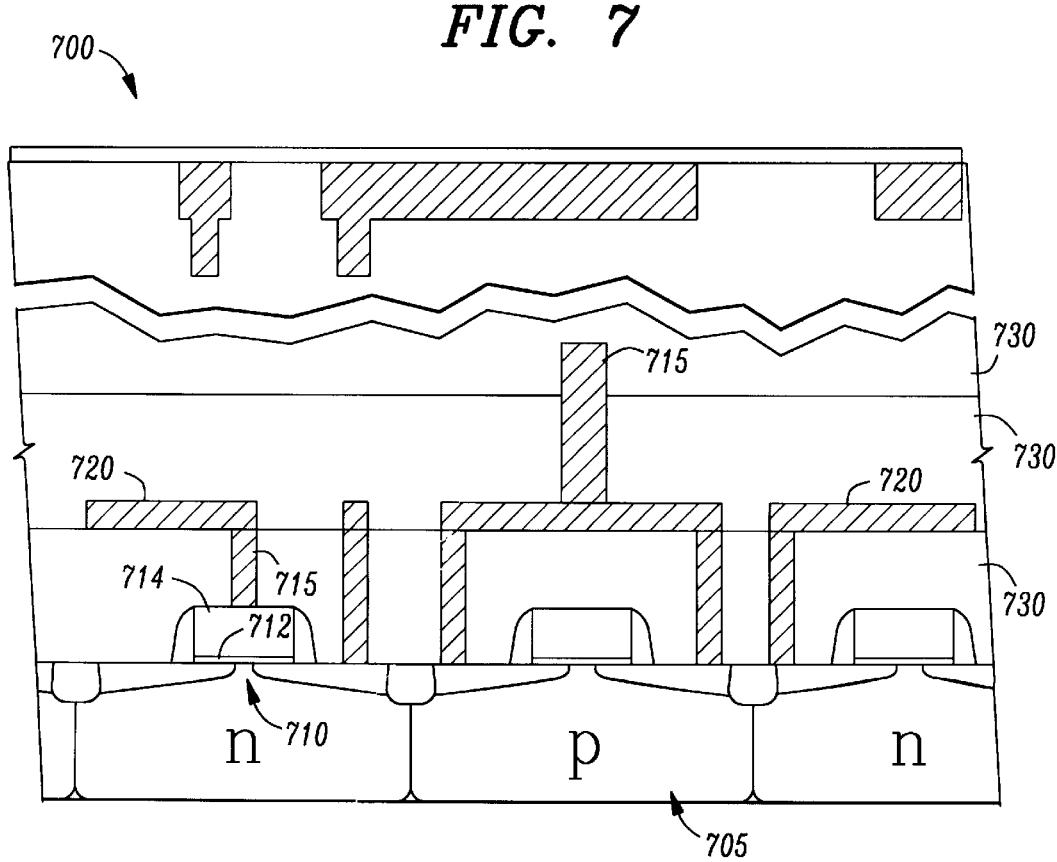
FIG. 7 illustrates a partial sectional view of an integrated circuit covered by the present invention.

Based on the foregoing, the method and device provided by the present invention can be used to fabricate a conventional integrated circuit (IC), such as the one illustrated in FIG. 7. Turning now to FIG. 7, there is illustrated is a partial sectional view of an IC 700 with which the present invention may be used. The IC 700 includes a transistor 710 that is connected to interconnects 720 by contacts or vias 715. Dielectric layers 730 isolate the various layers of the IC 700. As illustrated, the transistor 710 is located on a semiconductor wafer substrate (generally designated 705), and the interconnects 720, which are located within the dielectric layer 730, connect the transistor 710 to different layers within the IC circuit 700. Furthermore, the transistor 710 has a gate oxide 712 and a gate 714. One having skill in the art knows how to fabricate the transistors 710, interconnects 720, contacts or vias 715 and dielectric layers 730. Furthermore, it is also understood that multiple transistors 710, interconnects 720 and dielectric layers 730, are typically combined to form the IC 700. However, with respect to the formation of a dielectric that interfaces with a silicon, such as the gate oxide 712, the present invention may be employed to insure a high quality of the gate oxide 712. For example, during the fabrication step of depositing, the gate oxide 712, a test wafer that contains the deposited oxide layer that will be later formed into the gate oxide 712 can be removed from the fabrication line. The gate oxide layer can be tested with the method above described embodiment. If the gate oxide 712 contains an unacceptable number of interface traps, the portion of the fabrication process used to form the gate oxide 712 can be adjusted to reduce the number of interface traps and improve the overall quality of the gate oxide 712. Of course, the method covered by the present invention could be used to determine such electrical characteristics of any silicon/dielectric interface present within the IC.

Although the present invention has been described in detail, those skilled in the art should understand that they can make various changes, substitutions and alterations herein without departing from the spirit and scope of the invention in its broadest form.

What is claimed is:

1. A method of determining a trap density of a semiconductor substrate/dielectric interface, comprising:
    measuring a current within a semiconductor substrate resulting from a flow of carriers from traps located near the interface, the measured current being a function of the number of traps located at the interface; and
    determining the trap density as a function of the measured current.

2. The method as recited in claim 1 wherein measuring includes filling traps prior to the measuring.

3. The method as recited in claim 2 wherein filling traps includes depositing a charge on a surface of the dielectric layer to form a depletion region.

4. The method as recited in claim 3 wherein the substrate is doped with a p-type dopant and depositing a charge includes depositing a positive charge on the surface.

5. The method as recited in claim 3 wherein the substrate is doped with an n-type dopant and depositing a charge includes depositing a negative charge on the surface.

6. The method as recited in claim 3 further including forming a deep depletion region within the substrate by depositing a charge on the dielectric layer.

7. The method as recited in claim 6 wherein forming a deep depletion region includes depositing more of the charge on the surface of the dielectric layer.

8. The method as recited in claim 6 further including forming an accumulation region encompassed by the deep depletion region.

9. The method as recited in claim 8 wherein forming an accumulation region includes depositing an opposite charge through an opening in a guard ring and onto the surface to bring a portion of the deep depletion region into accumulation.

10. The method as recited in claim 8 wherein forming an accumulation region includes forming transient source/drain regions adjacent the accumulation region.

11. The method as recited in claim 1 wherein determining the trap density includes determining an interface trap charge ($N_{it}$) as a function of the current.

12. A method of fabricating an integrated circuit on a semiconductor wafer, comprising:

measuring a current within a semiconductor substrate resulting from a flow of carriers from traps located at an interface of the semiconductor substrate and a dielectric layer, the measured current being a function of the number of traps located at the interface;

determining an electrical characterization as a function of the measured current;

adjusting a semiconductor wafer fabrication parameter if the electrical characterization falls outside a desired range;

forming transistors on the semiconductor wafer; and interconnecting the transistors to form an operative integrated circuit.

13. The method as recited in claim 12 wherein measuring includes filling the traps prior to the measuring.

14. The method as recited in claim 13 wherein filling traps includes depositing a charge on a surface of the dielectric layer to form a depletion region.

15. The method as recited in claim 14 wherein the substrate is doped with a p-type dopant and depositing a charge includes depositing a positive charge on the surface.

16. The method as recited in claim 14 wherein the substrate is doped with an n-type dopant and depositing a charge includes depositing a negative charge on the surface.

17. The method as recited in claim 14 further including forming a deep depletion region within the substrate.

18. The method as recited in claim 17 wherein forming a deep depletion region includes depositing more of the charge on the surface of the dielectric layer.

19. The method as recited in claim 17 further including forming an accumulation region encompassed by the deep depletion region.

20. The method as recited in claim 19 wherein forming an accumulation region includes depositing an opposite charge through an opening in a guard ring and onto the surface to bring a portion of the deep depletion region into accumulation.

21. The method as recited in claim 20 wherein forming an accumulation region includes forming transient source/drain regions adjacent the accumulation region.

22. The method as recited in claim 12 wherein determining the electrical characterization includes determining an interface trap charge ($N_{it}$) as a function of the current.

23. A method of determining a trap density of a semiconductor substrate/dielectric interface, comprising:

filling traps located at the interface with minority carriers by forming a depletion region within a substrate;

collapsing at least a portion of the depletion region to either flatband or accumulation conditions; and determining the trap density as a function of a current resulting from a recombination of majority carriers with the minority carriers that occurs at either the flatband or accumulation conditions.

24. The method as recited in claim 23 wherein filling traps includes depositing a charge on a surface of a dielectric layer to form the depletion region.

25. The method as recited in claim 23 wherein filling traps includes depositing a charge on a surface of the dielectric layer to form an inversion region.

26. The method as recited in claim 24 wherein the substrate is doped with a p-type dopant and depositing a charge includes depositing a positive charge on the surface.

27. The method as recited in claim 24 wherein the substrate is doped with an n-type dopant and depositing a charge includes depositing a negative charge on the surface.

28. The method as recited in claim 24 further including forming a deep depletion region within the substrate.

29. The method as recited in claim 28 wherein forming a deep depletion region includes depositing more of the charge on the surface of the dielectric layer.

30. The method as recited in claim 28 further including forming an accumulation region encompassed by the deep depletion region.

31. The method as recited in claim 30 wherein forming an accumulation region includes depositing a charge through an opening in a guard ring and onto the surface to bring a portion of the deep depletion region into accumulation.

32. The method as recited in claim 30 wherein forming an accumulation region includes forming transient source/drain regions adjacent the accumulation region.

33. The method as recited in claim 23 wherein determining the trap density includes determining an interface trap charge ($N_{it}$) as a function of the current.

* * * * *